United States Patent
Hoffmeyer et al.

(10) Patent No.: US 11,456,548 B2
(45) Date of Patent: Sep. 27, 2022

(54) RELIABILITY ENHANCEMENT OF PRESS FIT CONNECTORS

(71) Applicant: International Business Machines Corporation, Armonk, NY (US)

(72) Inventors: Mark K. Hoffmeyer, Rochester, MN (US); Theron Lee Lewis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 359 days.

(21) Appl. No.: 16/574,845

(22) Filed: Sep. 18, 2019

(65) Prior Publication Data

US 2021/0083410 A1    Mar. 18, 2021

(51) Int. Cl.
| | |
|---|---|
| H05K 3/30 | (2006.01) |
| H01R 12/58 | (2011.01) |
| H05K 1/18 | (2006.01) |
| H05K 1/11 | (2006.01) |
| H05K 3/42 | (2006.01) |

(52) U.S. Cl.
CPC .......... H01R 12/585 (2013.01); H05K 1/115 (2013.01); H05K 1/184 (2013.01); H05K 3/308 (2013.01); H05K 3/42 (2013.01); H05K 2201/1059 (2013.01); H05K 2203/1105 (2013.01); H05K 2203/163 (2013.01)

(58) Field of Classification Search
CPC .. H05K 3/308; H05K 3/42; H05K 2203/1105; H05K 2203/163; H05K 1/115; H05K 1/184; H05K 2201/1059; H01R 12/585; Y10T 29/49139; Y10T 29/147

USPC .......................................... 29/832, 837, 842
See application file for complete search history.

(56) References Cited

U.S. PATENT DOCUMENTS

| | | | |
|---|---|---|---|
| 6,030,234 A | 2/2000 | Berg et al. | |
| 7,607,824 B2* | 10/2009 | Chandler | H05K 3/308 |
| | | | 250/338.1 |
| 7,922,545 B2 | 4/2011 | Saitoh | |
| 8,728,629 B2 | 5/2014 | Kitagawa et al. | |
| 8,771,028 B2 | 7/2014 | Tonosaki | |
| 10,677,856 B2* | 6/2020 | Hugo | H01R 12/585 |
| 2008/0188100 A1 | 8/2008 | Saitoh | |
| 2009/0239398 A1 | 9/2009 | Lynch et al. | |
| 2015/0011132 A1 | 1/2015 | Shibuya et al. | |
| 2015/0147924 A1 | 5/2015 | Shibuya et al. | |
| 2015/0214636 A1 | 7/2015 | Guenter et al. | |
| 2016/0268709 A1 | 9/2016 | Zeigmeister et al. | |

OTHER PUBLICATIONS

Nomura et al., "Press-fit Connector for Automobile ECUs," IEEE, Proceedings of the 52nd IEEE Holm Conference or Electrical Contacts, 2016, 6 pages.

(Continued)

*Primary Examiner* — Donghai D Nguyen
(74) *Attorney, Agent, or Firm* — Peter J. Edwards

(57) ABSTRACT

A method comprises inserting a press-fit element into a through hole on a substrate board. The method also comprises obtaining a target heat-application plan for the press-fit element. The method also comprises applying heat to the press-fit element. The method also comprises determining that the target heat-application plan has been completed. The method also comprises withdrawing heat from the press-fit element.

11 Claims, 5 Drawing Sheets

(56) References Cited

OTHER PUBLICATIONS

"CT-1025E Servo Press-fit Machine for Precise Connector," Shenzhen Zhizhan Electronics Co.,Ltd., Printed Jul. 30, 2019, 27 pages http://chiphua.com/wp-content/uploads/2015/03/SMT-Supporting-Equip.-Press-Fit-Machine-CT-1025E.pdf.

"Press-fit Technology," Vincotech, Printed Jul. 30, 2019, 3 pages https://www.vincotech.com/technology-innovation/press-fit-technology.html.

* cited by examiner

RELIABILITY ENHANCEMENT OF PRESS FIT CONNECTORS

BACKGROUND

The present disclosure relates to connections on substrate boards, and more specifically, to the connections of press-fit components on substrate boards.

Substrate boards, such as printed circuit boards and connector boards, may have a variety of components connected thereon. In some use cases, components may be attached to a substrate board using a press-fit connection. In a typical press-fit connection, a portion of the component (e.g., a pin, a lead, a post, a spring contact) is inserted into a plated through-hole in the substrate. This through hole is typically designed to be a size such that the portion (sometimes referred to herein as a press-fit element) does not enter the through hole without the application of force. When this force pushes the press-fit element into the plated through hole, the plated wall of the through hole may squeeze the press-fit element. This may cause the press-fit element to compress and results in a normal force of the press-fit element pushing back against the plated wall. The friction created by this rubbing may create enough heat to cause the metal of the press-fit element and the metal of the side of the through hole to form welding bonds. In typical press-fit connections, normal-force mechanical bonds and these minor welding bonds are intended to keep the press-fit element in place in the through hole and form an electrical connections. When sufficient normal force is applied, a gastight bond between the press-fit element and the plated through hole will result.

SUMMARY

Some embodiments of the present disclosure can be illustrated as a method comprising inserting a press-fit element into a through hole on a substrate board. The method may further comprise obtaining a target heat-application plan for the press-fit element. The method may further comprise applying heat to the press-fit element. The method may further comprise determining that the target heat-application plan has been completed. Finally, the method may further include withdrawing heat from the press-fit element.

Some embodiments of the present disclosure can also be illustrated as a system for post-press heating a press-fit connection. The system may comprise a substrate board and a through hole in the substrate board. The system may also comprise a press-fit element inserted into the through hole. The system may also comprise a first temperature probe configured to record a first temperature at the press-fit connection. Finally, the system may also comprise a heating element.

Some embodiments of the present disclosure can also be illustrated as a computer program product, the computer program product comprising a computer readable storage medium having program instructions embodied therewith. The program instructions may be executable by a computer to cause the computer to obtain a target heat-application plan for a press-fit connection. The program instructions may also cause the computer to activate a heating element. The program instructions may also cause the computer to monitor the temperature of the press-fit connection. The program instructions may also cause the computer to determine, based on the monitoring, that the target heat-application plan has been completed. Finally, the program instructions may also cause the computer to deactivate, based on the determining, the heating element.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
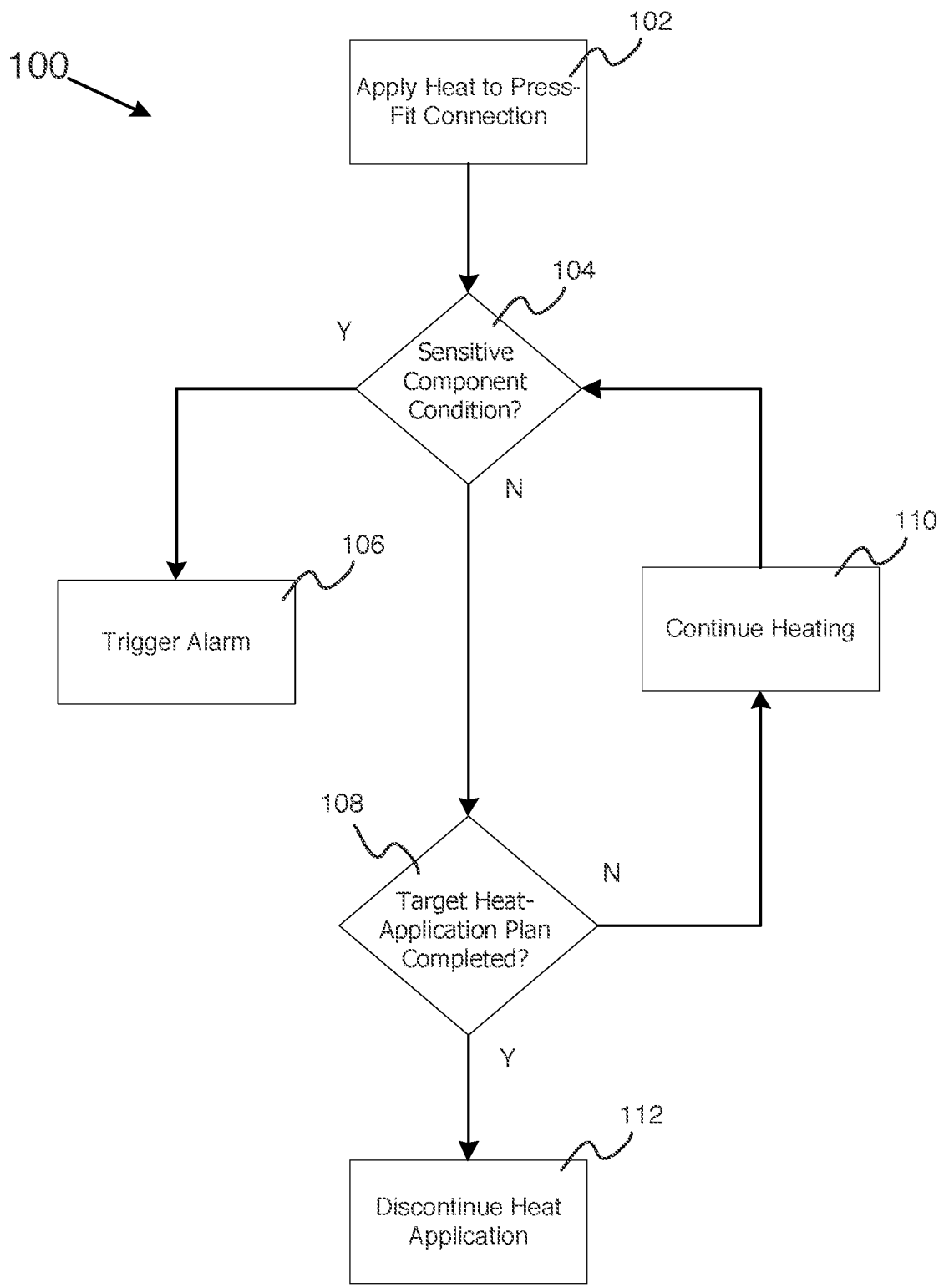
FIG. 1 depicts a method for applying heat to a press-fit connection in a substrate, in accordance with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to connections of components to substrate boards, more particular aspects relate to the connections of press-fit elements of those components on substrate boards. While the present disclosure is not necessarily limited to such applications, various aspects of the disclosure may be appreciated through a discussion of various examples using this context.

Substrate boards, such as printed circuit boards, sometimes contain through holes with which components may be mounted. Through holes sometimes take the form of holes that are drilled through all layers of the substrate board, allowing a portion of a component to be inserted into the through hole from a top side of the board and, in some instances, exit the hole from the bottom side of the board. These through holes may sometimes be treated with a metallic material (e.g., copper, silver, tin, nickel, or a mixture thereof), such that the interior wall of the through hole is coated in metal. This treatment may be referred to as "plating."

Components that are connected to the board by means of a through hole can be structurally attached to the through hole, allowing a strong connection to the board. In some use cases, structurally attaching a component to the board may take the form of soldering a portion of the component at the through hole. However, this method can increase the material cost of the overall device, as solder flux and paste must be purchased and applied. Thus, in some cases, it may be beneficial to structurally attach through-hole components by means of a press-fit connection.

In a press-fit connection, a component includes one or more connector elements (sometimes referred to herein as a "press-fit elements"). These press-fit elements are forcefully inserted into one or more through holes that would normally be too small to receive those press-fit elements without the use of that force. These press-fit elements may take the form of, for example, connector pins, leads, or posts. When the press-fit element is forced into the through hole, the press-fit element is compressed (and potentially deformed), causing the sides of the press-fit element to rub against the sides of the through hole at locations at which the press-fit element and through-hole wall interface. These locations may be referred to herein as "element-hole interface locations." Because of material variations and imperfections at the microscopic level, forcing a press-fit element into a through hole may create dozens or hundreds of microscopic interface locations (sometimes referred to herein as "asperity points," "asperity spots," or "A-spots"). Because of the friction created at asperity points during insertion, microwelds between the press-fit element material and the through-hole wall may form at some asperity points. In preferred circumstances, asperity points and microwelds would be frequent and large enough that a mechanical/gas tight bond would form between the surfaces of the press-fit element and the plating of the through holes. However, again because of the material variations of the press-fit element walls and through-hole wall, these interface locations may be surrounded by areas in which the element and wall do not come into physical contact.

The interaction of the element and through-hole wall at the asperity spots may cause friction during component insertion, which may cause the material of the press-fit element and through-hole wall to heat up. If the sides of the press-fit element and the through-hole wall are both plated with metal, the heat created by this friction may be sufficient to cause the metal of the press-fit element and the metal of the through-hole wall to bond together at some asperity spots. In some instances, this heat may cause actual microscopic melting of the two metals. In other embodiments, this heat may not be sufficient to cause micro welding of the metals, but may still be sufficient to create bonds between the metals at the atomic level.

In some use cases, the number and size of these press-fit bonds may be increased by designing press-fit elements to elastically conform to the shape of through-hole wall during insertion. For example, some press-fit elements take the form of compliant pins. Compliant pins are designed with geometries that, when the pins are deformed by insertion into a through hole, result in a desired mixture of plastic deformation and elastic deformation. Plastic deformation, as used herein, refers to deformation resulting from a stress that is sufficient enough to cause permanent formation. For this reason, plastic deformation does not increase the normal force between a pin and a through hole. Elastic deformation, as used herein, refers to deformation resulting from a stress that is only sufficient to cause temporary deformation. For this reason, elastic deformation of a pin inserted into a through hole increases the amount that the pin presses against the through hole, increasing the normal force between the pin and the through hole. Further, because elastic deformation of a pin causes the pin to press back against the surface of the wall, it may also increase the normal force between the pin and the wall if the metals of the via expand or contract after insertion.

For example, compliant pins often take the form of hollow pins of sufficient material flexibility that the process of inserting the pin into a correctly sized through hole causes the pin to deform to the size of the diameter of the hole. Due to the material elasticity of typical compliant pins, however, a compliant pin being forced into a through hole resists this deformation, causing it to press out against the wall of the through-hole. In through holes of appropriate diameters (including plating material), this can result in increased friction, and thus increased heat and increased bonding between the compliant pin and through-hole wall. This may increase the likelihood of a gas-tight seal between the compliant pin and through-hole wall. Further, if the diameter of the through hole expands during high periods of power use, the elastic deformation of the compliant pin may cause the pin to expand during the period as well, maintaining a gas-tight seal and signal integrity.

However, if a compliant pin is deformed by too great of a degree during insertion into a through hole, a higher amount of plastic deformation and lower amount of elastic deformation may result. This may occur, for example, if the diameter of through hole into which the pin is inserted is too small or the diameter of the pin is too large. In such a scenario, microwelds may form during insertion, but because plastic deformation is permanent, the pin may not expand if the diameter of the through-hole increases, reducing the contact between the pin and the wall of the through hole. This may create air gaps and reduce signal integrity until the diameter of the through hole reduces again. Further, if the diameter of the through hole actually decreases below the original diameter (e.g., if the metal plating of the through hole expands after the pin is inserted into the through hole), further plastic deformation of the pin may result, permanently deforming the pin to the contracted size of the through hole. Then, when the through hole returns to its original diameter, the pin may not expand, causing potentially permanent air gaps, loss of signal integrity, or even a lose pin.

On the other hand, if a compliant pin is not sufficiently deformed during insertion into a through hole, an insufficient amount of deformation (and thus elastic deformation) may result. This may occur, for example, if the diameter of through hole into which the pin is inserted is too large or the diameter of the pin is too small. This may cause a low amount of normal force between the pin and through hole wall, which may reduce the amount of microwelds and asperity points generated during insertion. This may prevent gas-tight seals from forming, prevent reliable signal integrity, and even cause the pins to be loose inside the through hole.

Thus, in theory, press-fit connections may enable strong bonds between press-fit elements and the substrate boards into which they are inserted. However, the effectiveness of press-fit connections may, in some use cases, be sensitive to manufacturing and process variation that can occur in typical component manufacturing. In other words, imperfections in manufacturing either a press-fit element or drilling/plating a through hole may deteriorate the effectiveness of a press-fit connection. In some use cases, the tolerance for those imperfections may be very low.

For example, if the diameter of a press-fit element (e.g., a compliant pin) is larger than the diameter specified in a design (for example, due to a manufacturing defect or typical manufacturing variation), a larger force may be necessary to insert the press-fit element into the through hole. This may also occur, for example, if the diameter of the opening of a through-hole is smaller than the diameter specified in a design. In some instances, this may be detrimental because the larger force used during press-fit element insertion may exceed the force tolerances of the components involved (e.g., the press-fit element, the through hole, the substrate board, or other attached components, such as a connector to which a compliant-pin press-fit element is attached). When these tolerances are exceeded, damage to any of the components may result. In some use cases, this may result in some components performing poorly, potentially leading to decreased utilization of the device into which the substrate board is being incorporated. In some use cases, this may also increase the cost of device into which the substrate board is being incorporated, because damaged components may need to be replaced, introducing added material and labor costs to the manufacturing process. In other embodiments, the overall device may be damaged beyond repair, and may amount to a total manufacturing loss.

Therefore, the costs of press-fit elements being larger than designed with respect to a corresponding through hole may be high in some use cases. For this reason, it may be beneficial in some use cases to err on the side of manufacturing press-fit elements smaller than designed rather than precisely as designed or larger than designed. Similarly, it may be beneficial in some use cases to err on the side of manufacturing through holes larger than designed rather than precisely as designed or smaller than designed (e.g., by drilling the holes slightly larger than a design specifies or plating the wall of the through hole slightly less than a design specifies). This may increase tolerance to manufacturing variation that could otherwise result in damage during press-fit element insertion. Also as a significant cost savings minimal amount of plating is done which also makes the diameters of the plate through holes larger tolerances However, in some use cases, detrimental effects may also result from a press-fit element being manufactured smaller than designed, or a through hole being manufactured larger than designed. For example, if the diameter of a press-fit element is smaller than the diameter specified in a design, the press-fit element may press against the wall of a through hole less than intended when inserted into the through hole. This may also occur, for example, if the diameter of the opening of a through-hole is larger than the diameter specified in a design. One or both of these scenarios may result in less friction being created between the walls of the press-fit element and the wall of the through hole when the press-fit element is inserted into the through hole. This may, in turn, create less retention/normal forces, heat and less bonding at the asperity spots. If insufficient normal forces and bonding occurs, several detrimental effects could result.

For example, insufficient bonding at asperity spots could result in reduced structural integrity of the press-fit connection and lowers the long term electrical reliability. This is because the structural connection between a press-fit element and a substrate board is sometimes largely or completely dependent on the bonding that results during the press-fit process. If insufficient bonding occurs, a press-fit element may be insufficiently bonded to the substrate board, and may, in some use cases, lose its gastight seal, oxidize and lose electrical connection. This may occur, for example, if the product into which the press-fit connection is incorporated is shipped to another location after manufacturing. The handling or jostling that may occur during this shipment may negatively impact the electrical connection between the press-fit element and the substrate board, and, in some instances, completely dislodge the press-fit element from the through hole.

Detrimental results may also occur even when the microwelds produced by normal-force friction are sufficient to maintain the structural integrity of the press-fit connection (even, for example, in the presence of impacts, jostling, or vibration). For example, insufficient normal force between the press-fit element and the through-hole wall at asperity spots may prevent gas-tight seals from forming. Designs for components and the substrates on which they are mounted often specify precise diameters of press-fit elements and corresponding through holes in an effort to create sufficient normal force for gas-tight seals between those press-fit elements and through holes.

However, in instances in which the size of a press-fit element is smaller than designed with respect to a corresponding through hole (e.g., a compliant pin is too small or the through hole is too large), the amount of force present asperity spots may be too small to create a gas-tight seal between the press-fit element and through-hole wall. In these instances, the metal compounds at the asperity points may corrode due to environmental exposure. In other instances environmental exposure can lead to impurities bonding to the metals with which the press-fit element and the through-hole wall are plated, forming a film within the through hole. This corrosion and film may have detrimental short-term and long-term results.

Thus, manufacturing a press-fit element to be smaller than designed with respect to a corresponding through hole (for example, because of manufacturing variation, lack of proper equipment or a desire to avoid component damage during the press-fit process) may have detrimental effects. In some instances, it may be possible to mitigate some such detrimental effects by soldering press-fit elements after the press-fit process. However, as discussed above, soldering can add expense to the manufacturing process. The cost of soldering flux and paste can increase the total material cost of the resulting product. Further, the soldering process may also need to be custom designed for the use case, which may be expensive. Worse, if manual soldering is required, the cost of human labor could significantly increase the manufacturing process. Finally, in some cases, soldering may not address electrical-communication issues resulting from air gaps between press-fit elements and through-hole wall.

Embodiments of the present disclosure address these and other issues by applying heat to press-fit locations after the press-fit process. This heating process may be referred to herein as "post-press heating," and may create similar effects to the heat created by friction during the press-fit process. In other words, post-press heating may cause the metals of press-fit elements and through-hole wall to expand, reducing air gaps therebetween, and may simultaneously cause added bonding between the press-fit elements and through-hole wall. In this way, embodiments of the present disclosure may increase structural integrity of press-fit connections, increase the electrical connectivity of press-fit connections, decrease the susceptibility of press-fit connections to environmental impurities, or a combination of the above.

In some embodiments of the present disclosure, post-press heating may be employed to deliver sufficient heat over time (referred to herein as "thermal energy") to cause a desired amount of bonding at a press-fit connection. However, the thermal energy that is required to achieve the desired bonding during post-press heating for a particular use case may vary significantly based on several variables (e.g., component densities, the heat capacity of the press-fit element and through-hole plating, mass of the press-fit element and the through-hole plating, the ability of the press-fit element and through-hole plating to conduct heat to surrounding components, and others). This required amount of thermal energy may be referred to herein as a "target thermal-energy value." Due to the number and complexity of the variables on which a target thermal-energy value depends, calculating a target thermal-energy value for a particular use may be difficult, or even infeasible.

However, in some embodiments, the thermal energy required may be estimated based on models created from historical post-press heating testing and applications. Exposing a component to a target thermal-energy value, as described herein, includes exposing that component to a temperature (or temperatures) for a certain amount of time, resulting in a target amount of thermal energy being transferred to that component. Thus, indirectly estimating a target thermal-energy value for a particular use case may be possible by comparing the known properties of the use case (e.g., mass, shape material properties, such as percentage of copper, of press-fit elements and through-hole plating) with the properties of prior successful post-press heating applications. By identifying prior applications with similar properties and determining the temperature to which the components in those prior applications were heated and the duration for which the components were heated to that temperature, an approximate heating regimen (i.e., temperature and duration) may be identified. This approximate heating regimen (also referred to herein as a "heat-application plan") may reflect the target thermal-energy value.

For this reason, directly estimating the actual value of the target thermal energy may be unnecessary in most instances, and the calculation is beyond the scope of this disclosure. Relevant to this disclosure, however, is the fact that a thermal-energy value, as discussed, depends upon temperature and time. For this reason, the same thermal-energy value may be reached by exposing a press-fit connection to a first temperature for a first amount of time, or a second temperature for a second amount of time. For example, in theory, the same thermal-energy value may be reached by exposing a press-fit connection to 250 degrees Celsius for 500 seconds or 187 degrees Celsius for 700 seconds. Thus, in theory, the same amount of bonding at a press-fit connection may be created by heating the press-fit connection to 250 degrees Celsius for 500 seconds or 187 degrees Celsius for 700 seconds.

For the purpose of this disclosure, the temperature to which to expose a press-fit connection and duration of that exposure may be referred to as a "heat-application plan." In some instances, multiple different heat-application plans may reach the same thermal-energy value, and thus may produce the same amount of bonding in the press-fit connection. However, developing heat-application plans for a particular use case may involve experimentation or comparison to historical heat-application plans.

In some embodiments of the present disclosure, melting of the metals that plate through-hole wall and press-fit elements may be desired. In these embodiments, significant bonding may occur between these metals, resulting in very strong and consistent connections between press-fit elements and through holes. For example, a compliant pin may be plated with a thin coating of tin, and a corresponding through hole may be plated with a coating of copper. In this example, the target thermal-energy value that would be sufficiently high to cause all portions of the tin coating to melt, expand, and bond with the copper plating. In this example, very few air gaps may remain after the press-fit connection cools, and the structural connection between the compliant pin and the through-hole wall may be very high.

In some embodiments of the present disclosure, post-press heating may be employed to expose a press-fit connection to a thermal-energy value that is not sufficient to cause macroscopic melting, but that may be sufficient to cause a solid-state bonding process. This solid-state bonding process may excite the metals on a microscopic metal to the point at which metallurgical bonding from atomic interdiffusion of the two metals into each other may occur. Using the previous example, a compliant pin may be plated with a thin coating of tin, and a corresponding through hole may be plated with a coating of copper. In this example, the target thermal-energy value would be sufficiently high to excite the tin and copper atoms to the point at which increased atomic bonding occurs between tin and copper atoms. Further, at sufficient levels of thermal energy, diffusion between the two metals may occur (i.e., some tin atoms may diffuse into the copper plating, and some copper atoms may diffuse into the tin plating). With this diffusion, the interface between the plating on the pin and the plating on the through-hole wall may cease being a distinct transition from tin directly to copper and tend towards a gradual shift from tin, to a mixture of tin and copper, to copper. Finally, sufficient thermal energy may also be applied to cause expansion of the metals, increasing the amount to which the two metals physically interface and, therefore, the amount that bonding and diffusion can occur.

In some embodiments of the present disclosure, heat may be applied to the entire substrate board simultaneously. This type of post-press heating may be referred to herein as globally heating the substrate board, global heating, or a global-heating process. In some embodiments, global heating may be performed by inserting the board into a sealed environment (e.g., an oven) containing an inert gas (e.g., gaseous nitrogen) and heating the gas in the environment. In some use cases, a global-heating process may offer benefits not offered by other post-press heating processes. For example, some use cases may involve a substrate board that comprises many press-fit connections. In these use cases, global heating may simultaneously apply heat to all press-fit connections, reducing the necessary duration of the overall post-press heating process. In some use cases, global heating may allow for the post-press heating to be substantially automated, because heat is applied by the environment surrounding the substrate board, rather than by manually operated tools.

In some use cases, global heating may also prevent physical disturbances to the board during the post-press-heating process. Again, because heat is applied by the environment surrounding the substrate board, the substrate board may be entirely stationary during a global-heating process. For example, the substrate board could be structurally secured by a holding apparatus in the heating environment. This holding apparatus may prevent the substrate board from moving during the processes, which may help to prevent components on the substrate board from shifting while being heated. This stability may also increase the advantage of delivering sufficient thermal energy to cause melting. Melting between the metals attaching components to the substrate board, while enabling particularly strong structural connections, may also enable components to shift if the substrate board is disturbed. This may be true of press-fit components and other components on the board that are also being heated. For example, components that are soldered to the substrate board (e.g., surface-mount components) may be susceptible to shifting if sufficient thermal energy is delivered to melt the solder that secures those components to the substrate board. Thus, the stability that is possible with a global-heating process may also make melting more beneficial.

In some use cases, however, global heating a substrate board may not be advisable. For example, in some embodiments a component mounted on a substrate board may be sensitive to heat, and may be damaged by the amount of thermal energy that may be desirable to apply at press-fit locations. In those embodiments, therefore, global heating may damage or destroy a component (or components). In some instances, this may require replacing the damaged (or destroyed) component, increasing the manufacturing cost of the device. However, in other instances, the damaged component may not be replaceable, which may make the overall product less useful or completely nonfunctional.

Therefore, in some embodiments of the present disclosure, heat may be applied to selected portions of the substrate board only. This type of post-press heating may be referred to herein as "localized heating," "selective heating," or "selectively heating." In selective heating, areas of the substrate board immediately surrounding a target press-fit connection may be heated. For example, a hot-air gun may fire hot gas (e.g., an inert gas) at the location at which a press-fit element exits a through-hole, heating the press-fit element and the through hole. As the heat spreads through the metal in the press-fit element and through hole wall, the metal may expand and bond together, as discussed above.

In some use cases selective heating may be beneficial because a press-fit element may be exposed to a target thermal-energy value (i.e., exposed to a certain temperature for a certain amount of time) while avoiding exposing other components on the board to temperatures above their tolerance. For example, it may be beneficial to achieve significant melting in a particular press-fit connection, but the substrate board may contain at least one temperature-sensitive component. If a compliant pin in the press-fit connection is plated with tin, reaching the required thermal-energy value to cause the tin to melt may involve heating the press-fit connection to a temperature of at least 232 degrees Celsius for several minutes. However, the temperature-sensitive component may be damaged if exposed to any temperature above 230 degrees Celsius. In this example, it may be possible to utilize global heating to achieve steady-state bonding (e.g., by heating the substrate board to 220 degrees Celsius), but may not be possible to utilize global heating to achieve significant melting without damaging components on the board. In this use case, selective heating may enable the desired thermal-energy at the press-fit connection to be reached.

However, while selective heating does enable localized heat exposure, it may have drawbacks in some use cases. For example, selective heating may require manual operation of a hot-air gun to direct heated inert gas to only the desired locations. In addition to increasing the labor cost of manufacturing the resulting product, this manual operation may also introduce the risk of human error (e.g., heating the wrong board location, exposing components to too much heat, exposing components to an insufficient temperature or duration). Further, manual intervention in the post-press heating may cause the substrate board to be less stable than in a global heating process. This may be particularly detrimental when exposing components to thermal energy sufficient enough to result in melting. In these instances, bumping or otherwise shifting the board while component connections have melted may cause the associated components to shift out of place, potentially decreasing their structural connection to the board or their electrical connection to the board or other board components. For these reasons, global heating may be preferred in some use cases.

Some embodiments of the present disclosure may further mitigate issues relating to heat-sensitive components by monitoring the temperature to which sensitive components are exposed during post-press heating. For example, in some embodiments a temperature probe may be temporarily attached to the board in close proximity to a heat-sensitive component. In some such embodiments, the temperature probe may take the form of a simple thermocouple that sends a signal to trigger an alarm when a sufficient temperature at the probe is reached. In some embodiments, the temperature may take the form of a thermometer, which may periodically or constantly record and report the temperature at the probe. In some embodiments, data from the temperature probe may be expressed as a function over time, which may enable a monitoring system to calculate the thermal energy to which the temperature-sensitive component has been exposed.

FIG. 1 illustrates a method 100 of heating a press-fit connection to a heat-application plan, in accordance with embodiments of the present disclosure. In some embodiments, method 100 may be performed automatically by an apparatus and computer system that are designed to apply heat to a press-fit connection, monitor the thermal energy delivered to the board during the heat application, adjust the heat-application plan as necessary, and automatically terminate heat application when the heat-application plan has completed. For example, method 100 may be performed by a computer with access to temperature probes scattered throughout a substrate board. The computer may control the temperature of an inert-gas filled oven into which the substrate board and temperature probes are inserted.

In block 102, heat is applied to the press-fit connection. In some embodiments, the heat application in block 102 may take the form of global heat application, whereas in other embodiments, the heat application in block 102 may take the form of selective heat application. For example, in embodiments in which all components on the substrate board are secured by a press-fit connection, utilizing global heat application may be beneficial for reasons discussed above. However, if, for example, a substrate board contained multiple components with low tolerance for high temperatures, selectively heating the press-fit connections may be more beneficial.

In some embodiments, selectively heating a press-fit element may not be sufficient to avoid potential damage to a nearby component. For example, if the selective heat is being applied by dispensing hot air (e.g., nitrogen gas) from a hot-air gun onto the press-fit connection, some of the hot air may not hit the press-fit element, but rather may hit, for example, a nearby surface-mount component that is sensitive to high temperatures. This may cause the temperature at the surface-mount controller to increase, creating a risk that the surface-mount device may be damaged by the heat application of block 102.

This is addressed in block 104, in which it is determined whether the conditions for a sensitive-component alarm have been met. For example, a computer may receive data from a temperature probe at the location of a sensitive component, a thermostat in an oven in which the substrate board is secured, or both. For example, a computer may monitor the temperature at the one or more temperature probes to determine whether a sensitive component on the board has been subject to a threshold amount of thermal energy. This may involve, for example, constantly recording the temperature at the applicable temperature probe and determining, based on the amount of time the temperature probe has recorded a given, how much thermal energy has been applied to the sensitive component during the post-press heating that began in block 102. This may also involve, for example, recording the temperature at the applicable temperature probe and determining whether a minimum threshold temperature has been reached.

If, in block 104, it is determined that a condition for a sensitive-component alarm has been met, an alarm is triggered in block 106. In some embodiments, this alarm may take the form of a notification to a user that the condition was met. In these embodiments, the user may decide whether to take further action (e.g., to reduce the temperature applied to the press-fit connection). In some embodiments, this may also take the form of a computer that is managing method 100 terminating the application of heat to allow the sensitive component to cool. In some embodiments, the alarm may also take the form of a computer that is managing method 100 adjusting the heat-application plan (for example, by heating to a lower temperature and but for a longer duration).

If, on the other hand, it is determined in block 104 that a condition for a sensitive component alarm has not been met, it is determined, in block 108, whether a target heat-application plan has been completed. As discussed herein, this heat-application plan may be a function of temperature and time, and may be based on historical heat-application plans performed on press-fit connections with similar properties.

In some embodiments, the target heat-application plan may be determined in part by the objective for the press-fit connection. In embodiments in which significant melting is desired, for example, historical heat-application plans that resulted in significant melting may be utilized. In embodiments in which steady-state bonding is desired, however, historical heat-application plans that involved lower temperatures or shorter durations may be utilized. Further, in some embodiments, multiple heat-application plans may be possible to achieve the same result. For example, to achieve macroscopic melting, a tin-copper press-fit connection may be exposed to 232 degrees Celsius for 20 minutes in a first heat-application plan, or 250 degrees Celsius for 17 minutes in a second heat-application plan. However, to achieve steady-state bonding, a tin-copper press-fit connection may be exposed to temperatures at 200 degrees Celsius for 10 minutes in a first heat-application plan, or 190 degrees Celsius for 12 minutes in a second heat-application plan.

Similarly, in some embodiments, heat-application plan may be determined in part by the extent of diffusion that is desired. As discussed throughout the disclosure, the metal of a press-fit element may diffuse into the metal of the through-hole wall (sometimes referred to herein as "atomic interdiffusion"). In some embodiments, only partial diffusion may be necessary. However, in other embodiments, complete diffusion may be desirable. In embodiments in which a compliant pin is plated in tin and inserted into a through hole plated with copper, complete diffusion may result in all atoms of tin permeating into the copper plating and reacting with the copper atoms. In the aggregate, this may result in a layer of tin-copper mixture where the tin plating used to be, gradually transitioning to solid copper nearer the through-hole wall.

In some embodiments, a sensitive component condition may restrict the potential the heat-application plans. The nature of this restriction may be based on the nature of the sensitive component condition. For example, if the sensitive component condition is expressed in terms of the maximum thermal-energy value that a component can absorb, a three-dimensional thermal-energy value curve (also referred to herein as a time-and-temperature curve) may be restricted to thermal-energy values that are below that maximum thermal-energy value. If global heating is to be pursued, only heat-application plans that result in thermal-energy values below that maximum thermal-energy value may be applied. If, on the other hand, the thermal-energy value that is required to heat the press-fit connection is above the maximum thermal-energy value for the sensitive component, selective heating may be pursued.

In other instances, the sensitive component condition may be expressed in terms of the maximum temperature a component can be exposed to. In these embodiments, any heat-application plans that require temperatures at or above that maximum temperature may not be viable applications to reach the target thermal-energy value at the press-fit connection, and may be restricted from consideration. In other words, a three-dimensional time-and-temperature curve may be restricted such that no heat application plans (e.g., a pair of temperature and duration coordinates) that rely upon temperatures that are as high or higher than that maximum temperature would be included in the curve.

In some embodiments of the present disclosure, the material of the plating on the through-hole wall and the press-fit element may affect the target thermal-energy value. For example, if a press-fit element is plated in pure tin, a relatively large thermal-energy value may be required to achieve sufficient thermal bonding. However, if the press-fit element is plated in a tin-bismuth mixture, a smaller thermal-energy value may be necessary due to the lower melting point of tin bismuth. Thus, in this embodiment, a heat-application plan that involves exposing the press-fit connection to 150 degrees C. for 10 minutes may be selected.

If it is determined, in block 108, that the target heat-application plan has not been completed, heat-application plan continues in block 110. However, if it is determined, in block 108, that the target heat-application plan has been completed, the computer system may discontinue applying heat to the press-fit connection in block 112, ending method 100.

In some embodiments of the present disclosure, block 108 may be performed by a computer system that is collecting temperature data from temperature probes near the press-fit connection on a periodic basis. In some embodiments, therefore, it may be possible for such a computer system to perform block 104 and block 108 frequently (e.g., every microsecond). In these embodiments, the computer system would be able to discontinue heating very precisely, preventing excess heating costs and avoiding potential unnecessary damage to board components caused by excess heating.

In some embodiments of the present disclosure, blocks 104, 108, and 110 may be performed simultaneously on a periodic basis by a computer system that is monitoring and managing the post-press heating. For example, the computer system may periodically detect the temperature to which each component (e.g., a compliant pin, through hole, and multiple heat-sensitive surface-mount components) have been exposed during the post-press heating process. The computer system may also compare that temperature to a maximum temperature that may trigger a sensitive component condition.

In another example, the computer system may determine, during every microsecond of post-press heating, whether a sensitive-component condition has been detected and whether the target heat-application plan has been completed. Further, based on each of those determinations, the computer system may determine, as part of block 110, for example, whether the heat-application plan should be adjusted. For example, if a sensitive component condition is detected, the computer system may determine to adjust the heat-application plan by decreasing the temperature and increasing the duration. If, on the other hand, the press-fit element took longer to reach equilibrium at the temperature in a target heat-application plan than expected, (for example, because of heat loss to the surrounding environment) the computer system may adjust the duration or increase heat application. Based on the calculations performed every microsecond, the computer system may discontinue heat as part of block 106 if it determines that a sensitive component condition has been detected, or in block 112 if it determines that the target heat-application plan has been completed.

Figure 2A:
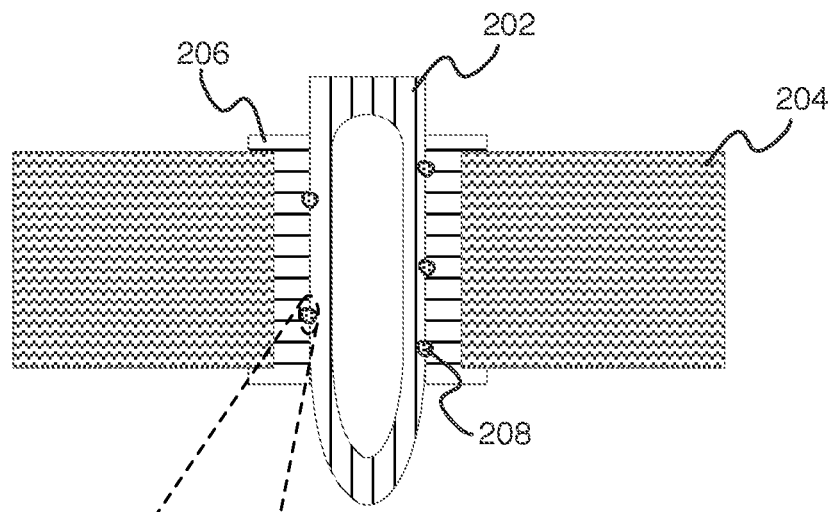
FIG. 2A depicts an abstract illustration of a press-fit element in a through hole at the beginning of a heating process, in accordance with embodiments of the present disclosure.

For the purpose of understanding, FIGS. 2A through 2E disclose an abstract illustration of one example of the effects of post-press heating. FIG. 2A discloses a cross-section view of a compliant pin 202 that has been forced into a through hole of a substrate board 204 during a press-fit operation. As illustrated, compliant pin 202 is a hollow pin that is composed of a single material (e.g., a conductive metal) for the purpose of understanding. In some embodiments of the present disclosure, however, compliant pin 202 may be a hollow pin that is composed of at least two metals: a core metal (e.g., nickel) and a thin layer of a plating metal (e.g., tin, tin-bismuth) surrounding the core metal. The through hole, as illustrated, is plated with a metal plating 206 (e.g., copper, silver). Bonding sites 208 represent the microscopic bonds between compliant pin 202 and metal plating 206 that formed during the press-fit operation. As illustrated, few bonding sites 208 are shown in FIG. 2A, which represents the limited ability of the press-fit operation to form sufficient bonds from friction heat alone. For example, an undesirably low amount of friction bonding may have occurred if the diameter of metal plating 206 (i.e., the diameter of the through hole) was larger than specified in the substrate board design due to, for example, manufacturing imprecision (e.g., incorrect drill size, insufficient plating duration). As will be shown in FIGS. 2B through 2E, the number and size of bonding sites 208 may be increased using post-press heating.

Figure 2B:
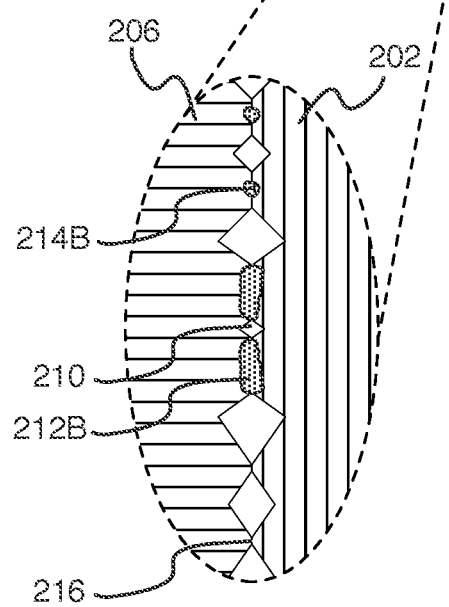
FIG. 2B depicts an abstract illustration of a magnified view of a wall of the press-fit element interfacing with a wall of the through hole at the beginning of the heating process, in accordance with embodiments of the present disclosure.

FIG. 2B illustrates a magnified view of one of bonding sites 208 prior to post-press heating (i.e., as illustrated in FIG. 2A). The scale of FIG. 2B shows the microscopic textures of metal plating 206 and compliant pin 202. Specifically, neither surface is smooth/flat. Rather, both metal plating 206 and compliant pin 202 are uneven, resulting in air gaps 210 between the two surfaces. Further, as shown in FIG. 2B, bonding sites 208, as illustrated in FIG. 2A, are actually composed of multiple microscopic bonds, such as bonds 212B and 214B. Bonds 212B and 214B may be, for example, regions in which the metals of compliant pin 202 (e.g., tin, or (Sn)) and metal plating 206 (e.g., copper, or "Cu") have diffused into each other, creating a compound of the combined metals (e.g., $Cu_6Sn_5$).

As is also shown in FIG. 2B, bond 214B did not completely form during the press-fit process. In other words, the asperity spot at which bond 214B is located has only been partially bonded. This may be due to, for example, insufficient friction resulting from compliant pin 202 being sized slightly smaller than intended. Further, asperity point 216 represents a location at which compliant pin 202 and metal plating 206 did come into contact during the press-fit process, but at which the friction created was insufficient to create friction bonding.

Figure 2C:
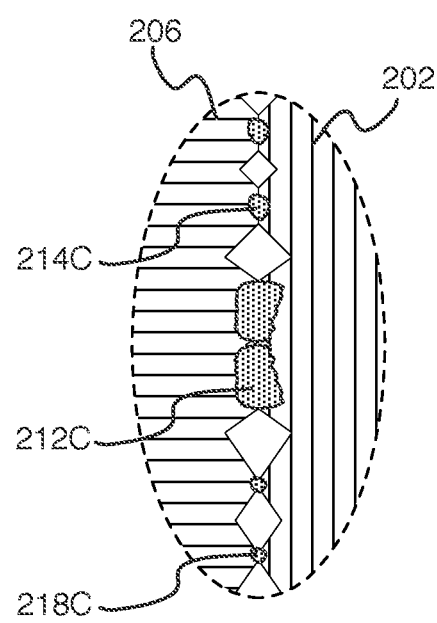
FIG. 2C depicts an abstract illustration of a magnified view of the wall of the press-fit element interfacing with the wall of the through hole at a second stage of the heating process, in accordance with embodiments of the present disclosure.

FIG. 2C illustrates the magnified view of FIG. 2B after a first duration of post-press heating (e.g., after 20 minutes of post-press heating). As shown, bond 212C has increased in size significantly. To begin, bond 212C has spread horizontally into metal plating 206 and compliant pin 202 by means of diffusion. Further, the heat to which metal plating 206 and compliant pin 202 have been exposed has cause the metals to expand, which has resulted in bond 212C, together with a nearby bond, to reduce the size of air gap 210. As is also shown, bond 214C has also increased in size, both along the interface of compliant pin 202 and metal plating 206, but also through diffusion into compliant pin 202 and metal plating 206. Finally, the heat to which the press-fit connection has been exposed has resulted in the formation of bond 218C at the previous location of asperity point 216.

Figure 2D:
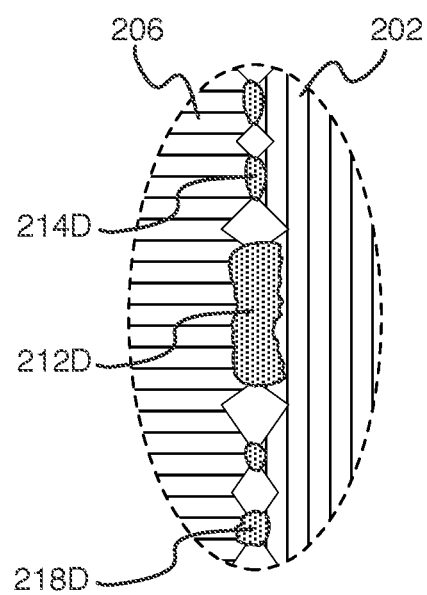
FIG. 2D depicts an abstract illustration of a magnified view of the wall of the press-fit element interfacing with the wall of the through hole at a third stage of the heating process, in accordance with embodiments of the present disclosure.

FIG. 2D illustrates the magnified views of FIG. 2B and FIG. 2C after a further duration of post-press heating (e.g., after 40 minutes of post-press heating). As shown, bond 212D has increased further in size to the point at which it has merged with a nearby bonding region and completely closed air gap 210. Bond 214D further increased in size and now envelops the entire asperity spot. Finally, bond 218D has grown in size significantly, and is reducing the size of a nearby air gap through expansion of the metals within compliant pin 202 and metal plating 206 adjacent to bond 218D. As illustrated, all of bonds 212D, 214D, and 218D have also increased the extent to which they have diffused into compliant pin 202 and metal plating 206. These changes, resulting from post-press heating, may have significantly increased the bond strength of the press-fit connection.

Figure 2E:
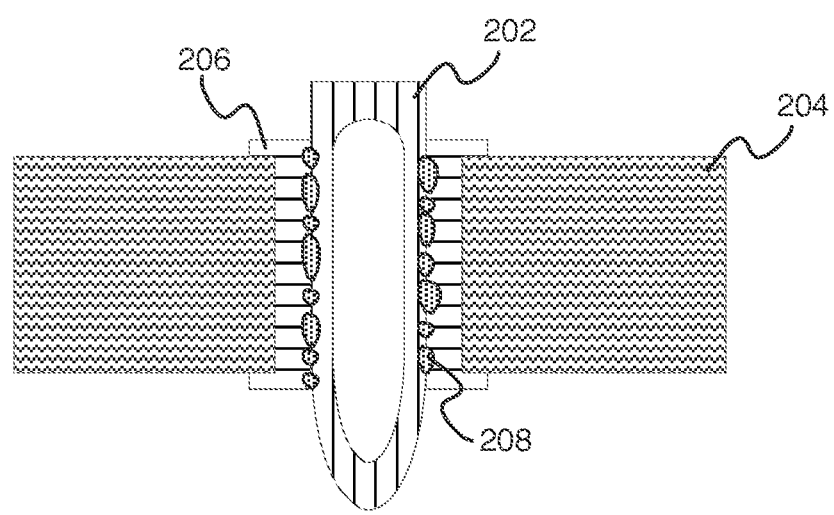
FIG. 2E depicts an abstract illustration of the press-fit element in the through hole after the post-press heating process has been completed, in accordance with embodiments of the present disclosure.

Finally, FIG. 2E illustrates the press-fit connection after post-press heating. The number of depicted bonding sites 208 has increased from 5 to 15 to illustrate the increased bonding created by the post-press heating in this embodiment, both at the previous 5 bonding sites, but also at sites that previously had no friction bonds present. Further, the size of bonding sites 208 have also increased, signifying that the bonds therein are larger and have diffused further into compliant pin 202 and metal plating 206. While, as illustrated, there are some asperity spots in FIG. 2E at which no bonding site is present, in some embodiments it may be possible to continue post-press heating past the points illustrated in FIGS. 2D and 2E. For example, in some embodiments it may be possible to expose the press-fit connection to such a high thermal-energy value that bonds 212D, 214D, and 218D continue to grow and, eventually, span the entire region illustrated in FIG. 2D. Similarly, in some embodiments it may be possible to expose the press-fit connection to such a high thermal-energy value that the entire interface between compliant pin 202 and metal plating 206 is covered by a single, continuous bonding site 208.

As discussed previously, in some embodiments a computer system may monitor and control a post-press heating process, enabling the automatic and precise adjustment of heat-application plans or termination of heat as may be necessary when a sensitive component is present on the board or when a target thermal-energy value has been reached. As also discussed, in some embodiments that computer system may monitor temperature probes on the substrate board, in the heating chamber, or both, to assist in monitoring and control.

Figure 3:
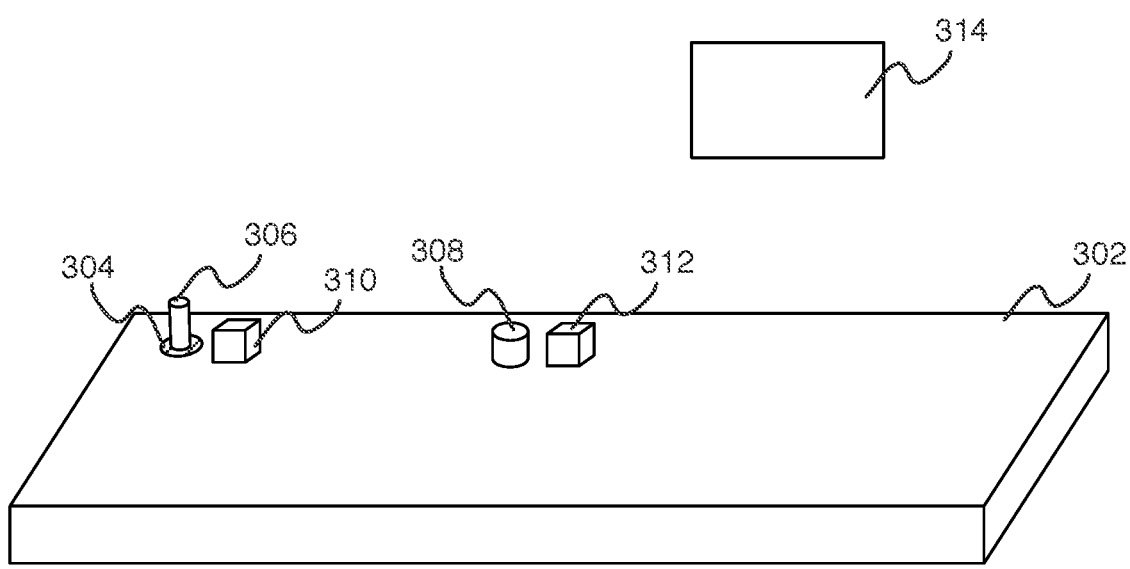
FIG. 3 depicts an abstract illustration of a substrate board on which post-press heating may be performed in accordance with embodiments of the present disclosure.

FIG. 3 depicts an abstract illustration of a substrate board 302 that may be monitored by a computer system during controlled post-press heating. Substrate board 302 comprises through hole 304, which, as illustrated, has been plated with metal and into which compliant pin 306 has been inserted. Substrate board 302 also comprises sensitive component 308, which may become damaged if exposed to temperatures above a minimum value or to thermal-energy values above a minimum value. In addition, a heating element, which is not illustrated in FIG. 3, may be necessary for post-press heating. As used herein, a heating element may refer to a localized heating element (e.g., a torch, a hot-air gun) or a global heating element (e.g., an oven into which a substrate board has been inserted)

To aid in the monitoring and control of the post-press heating, temperature probes 310 and 312 have been placed on the substrate board near through hole 304 and sensitive component 308 respectively. Temperature probes 310 and 312 may periodically transmit temperature data to a computer system (not pictured in FIG. 3) that is monitoring and controlling post-press heating. As such, temperature probes 310 and 312 may assist the computer system in monitoring and controlling a selecting post-press heating process or a global post-press heating process. Finally, FIG. 3 illustrates temperature probe 314, which may be a temperature probe located in a heating oven, which be used for assisting the computer system in monitoring and controlling a global post-press heating process.

Figure 4:
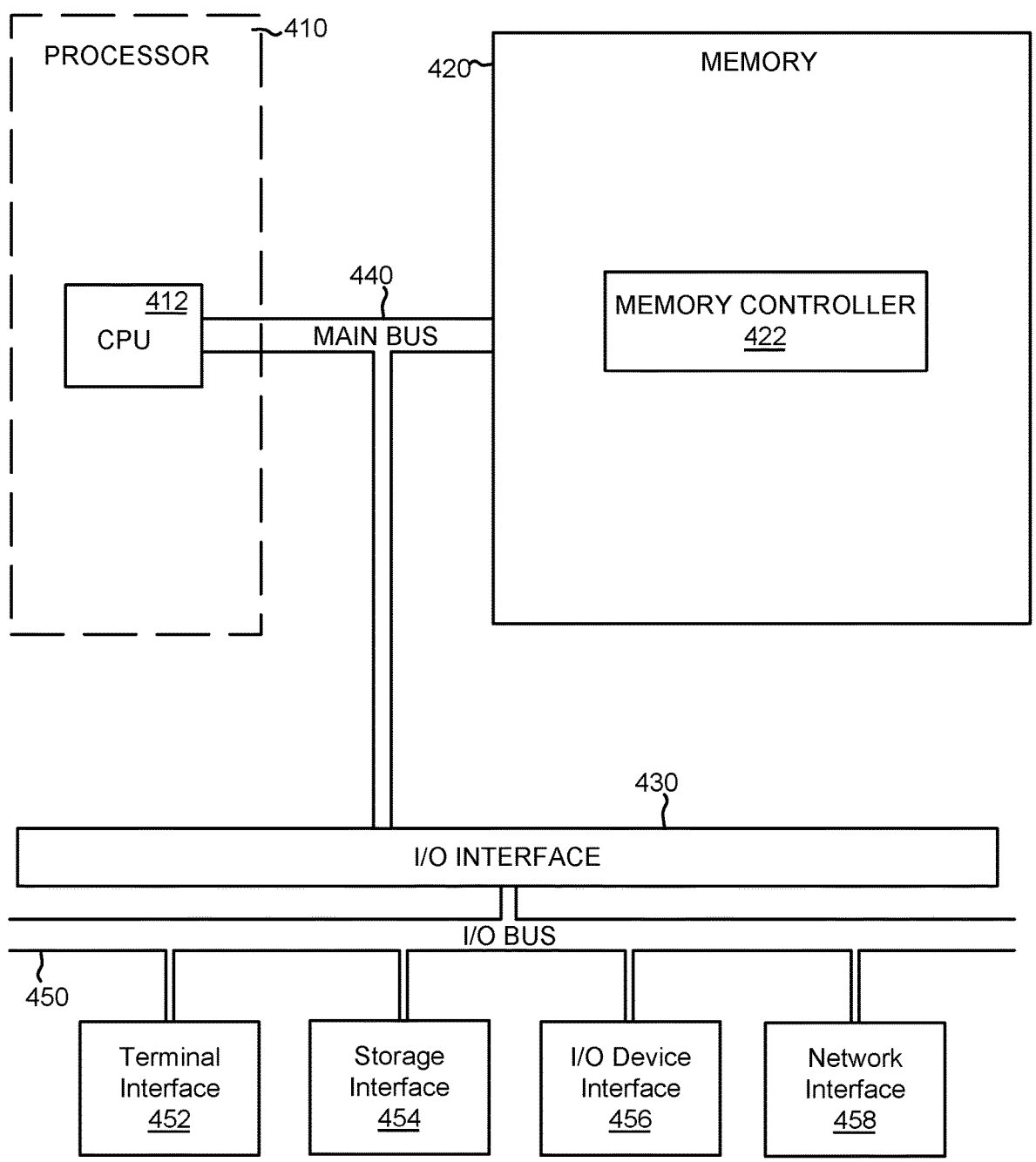
FIG. 4 depicts the representative major components of an example computer system that may be used to monitor and control a post-press heating process in accordance with embodiments of the present disclosure.

FIG. 4 depicts the representative major components of an example Computer System 401 that may be used in accordance with embodiments of the present disclosure. The particular components depicted are presented for the purpose of example only and are not necessarily the only such variations. The Computer System 401 may include a Processor 410, Memory 420, an Input/Output Interface (also referred to herein as I/O or I/O Interface) 430, and a Main Bus 440. The Main Bus 440 may provide communication pathways for the other components of the Computer System 401. In some embodiments, the Main Bus 440 may connect to other components such as a specialized digital signal processor (not depicted).

The Processor 410 of the Computer System 401 may include one or more CPUs 412. The Processor 410 may additionally include one or more memory buffers or caches (not depicted) that provide temporary storage of instructions and data for the CPU 412. The CPU 412 may perform instructions on input provided from the caches or from the Memory 420 and output the result to caches or the Memory 420. The CPU 412 may include one or more circuits configured to perform one or methods consistent with embodiments of the present disclosure. In some embodiments, the Computer System 401 may contain multiple Processors 410 typical of a relatively large system. In other embodiments, however, the Computer System 401 may be a single processor with a singular CPU 412.

The Memory 420 of the Computer System 401 may include a Memory Controller 422 and one or more memory modules for temporarily or permanently storing data (not depicted). In some embodiments, the Memory 420 may include a random-access semiconductor memory, storage device, or storage medium (either volatile or non-volatile) for storing data and programs. The Memory Controller 422 may communicate with the Processor 410, facilitating storage and retrieval of information in the memory modules. The Memory Controller 422 may communicate with the I/O Interface 430, facilitating storage and retrieval of input or output in the memory modules. In some embodiments, the memory modules may be dual in-line memory modules.

The I/O Interface 430 may include an I/O Bus 450, a Terminal Interface 452, a Storage Interface 454, an I/O Device Interface 456, and a Network Interface 458. The I/O Interface 430 may connect the Main Bus 440 to the I/O Bus 450. The I/O Interface 430 may direct instructions and data from the Processor 410 and Memory 420 to the various interfaces of the I/O Bus 450. The I/O Interface 430 may also direct instructions and data from the various interfaces of the I/O Bus 450 to the Processor 410 and Memory 420. The various interfaces may include the Terminal Interface 452, the Storage Interface 454, the I/O Device Interface 456, and the Network Interface 458. In some embodiments, the various interfaces may include a subset of the aforementioned interfaces (e.g., an embedded computer system in an industrial application may not include the Terminal Interface 452 and the Storage Interface 454).

Logic modules throughout the Computer System 401—including but not limited to the Memory 420, the Processor 410, and the I/O Interface 430—may communicate failures and changes to one or more components to a hypervisor or operating system (not depicted). The hypervisor or the operating system may allocate the various resources available in the Computer System 401 and track the location of data in Memory 420 and of processes assigned to various CPUs 412. In embodiments that combine or rearrange elements, aspects of the logic modules' capabilities may be combined or redistributed. These variations would be apparent to one skilled in the art.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method comprising:
    inserting a press-fit element into a through hole on a substrate board;
    obtaining a sensitive-component condition for a component on the substrate board;
    obtaining a target heat-application plan for the press-fit element;
    applying heat to the press-fit element;
    detecting that the sensitive-component condition has been reached at the component on the substrate board;
    triggering, based on the detecting that the sensitive-component condition has been reached, a sensitive-component alarm,
    determining that the target heat-application plan has been completed; and
    withdrawing heat from the press-fit element.

2. The method of claim 1, wherein applying heat to the press-fit element comprises:
    determining a time-and-temperature curve to secure the press-fit element in the through hole, wherein the time-and-temperature curve comprises a set of temperature values that are each paired with a corresponding time value and wherein each pair of temperature values and corresponding time values represents a heat-application plan;

selecting, from the time-and-temperature curve, the target heat-application plan; and increasing a temperature at the press-fit element to a temperature value corresponding to the selected target heat-application plan.

3. The method of claim 2, further comprising:

obtaining a heat-sensitivity value for a component on the substrate board; and restricting the time-and-temperature curve by the heat-sensitivity value, resulting in a restricted set of temperature values that are each paired with a corresponding time value;

wherein the target heat-application plan is selected from the restricted set of temperature values.

4. The method of claim 1, wherein the determining comprises:

identifying a target time value; and concluding that the target time value has been reached.

5. The method of claim 1, wherein the triggering comprises reducing the heat applied at the press-fit element.

6. The method of claim 1, wherein the applying heat comprises applying heat to the entire substrate board simultaneously.

7. The method of claim 1, wherein the applying heat comprises applying heat to selected portions of the substrate board.

8. A computer program product, the computer program product comprising a computer readable storage medium having program instructions embodied therewith, the program instructions executable by a computer to cause the computer to:

obtain a target heat-application plan for a press-fit connection;

obtain a sensitive-component condition for a component on a substrate board;

activate a heating element to heat a press-fit element in a through hole on the substrate board;

monitor a first temperature of the press-fit connection;

monitor a second temperature of the component;

detect, based on the monitoring the second temperature, that the sensitive-component condition has been reached at the component on the substrate board;

trigger, based on the detecting that the sensitive-component condition has been reached, a sensitive-component alarm;

determine, based on the monitoring the first temperature, that the target heat-application plan has been completed; and deactivate, based on the determining, the heating element.

9. The computer program product of claim 8, wherein the program instructions further cause the computer to:

determine a time-and-temperature curve to secure the press-fit element in the through hole, wherein the time-and-temperature curve comprises a set of temperature values that are each paired with a corresponding time value and wherein each pair of temperature values and corresponding time values represents a heat-application plan;

select, from the time-and-temperature curve, the target heat-application plan; and increase a temperature at the press-fit element to a temperature value corresponding to the selected target heat-application plan.

10. The computer program product of claim 8, wherein the determining comprises:

identifying a target time value; and concluding that the target time value has been reached.

11. The computer program product of claim 8, wherein the triggering comprises reducing the heat applied by the heating element.

* * * * *